United States Patent [19]
Elliott et al.

[11] Patent Number: 4,965,479
[45] Date of Patent: Oct. 23, 1990

[54] SURFACE TRANSVERSE WAVE RESONATOR

[75] Inventors: Scott S. Elliott; Robert C. Bray, both of Santa Rosa; Timothy L. Bagwell, Rohnert Park; Peter S. Cross, Palo Alto, both of Calif.

[73] Assignee: Hewlett-Packard Company, Palo Alto, Calif.

[21] Appl. No.: 504,065

[22] Filed: Mar. 29, 1990

Related U.S. Application Data

[63] Continuation of Ser. No. 387,431, Jul. 27, 1989, abandoned, which is a continuation of Ser. No. 262,207, Oct. 19, 1988, abandoned, which is a continuation of Ser. No. 1,948, Jan. 12, 1987, abandoned.

[51] Int. Cl.⁵ .............................................. H01L 41/08
[52] U.S. Cl. ................................ 310/313 D; 333/153; 333/195
[58] Field of Search ........... 310/313 R, 315 A, 313 B, 310/313 C, 313 D; 333/150–156, 193–196

[56] References Cited

U.S. PATENT DOCUMENTS

| | | | |
|---|---|---|---|
| 3,886,504 | 5/1975 | Hartmann et al. | 310/313 D |
| 4,054,851 | 10/1977 | Borner et al. | 310/313 D |
| 4,144,507 | 3/1979 | Shreve | 333/153 X |
| 4,204,178 | 5/1980 | Mitchell | 310/313 D X |
| 4,349,794 | 9/1982 | Kagiwada et al. | 333/195 X |
| 4,609,891 | 9/1986 | Solie et al. | 310/313 D X |
| 4,616,197 | 10/1986 | Wright | 310/313 D X |

FOREIGN PATENT DOCUMENTS 0123051 10/1978 Japan .................................. 333/153

Primary Examiner—Mark O. Budd
Attorney, Agent, or Firm—William C. Milks, III

[57] ABSTRACT

A surface transverse wave resonator comprises a piezoelectric substrate having at least one surface, wherein said substrate includes a crystalline structure that permits the propagation of transverse waves. The resonator also comprises a transducing set of periodic perturbations which are positioned atop the substrate surface, wherein the transducing set converts electromagnetic energy from an external source into the transverse waves. The resonator further comprises a receiving set of periodic perturbations which are positioned atop the substrate surface remote of the transducing set of periodic perturbations, wherein the receiving set converts the transverse waves into resultant electromagnetic energy. Moreover, the resonator includes a central set of surface-trapping periodic perturbations for maintaining the transverse waves adjacent to the substrate surface, wherein the central set is positioned intermediate the transducing set and the receiving set. Further, the resonator includes at least two sets of reflecting periodic perturbations for reflecting the transverse waves, wherein each of the sets of reflecting periodic perturbations is positioned adjacent to a respective one of the transducing set and the receiving set remote of the central set.

21 Claims, 2 Drawing Sheets

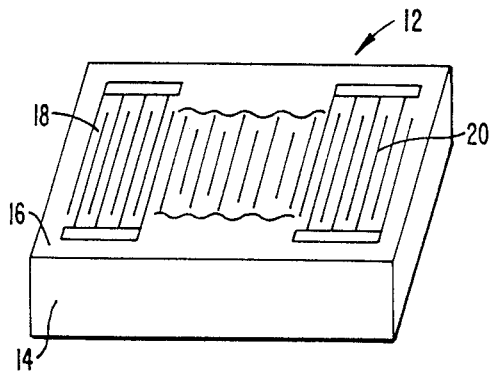
FIG._1A.
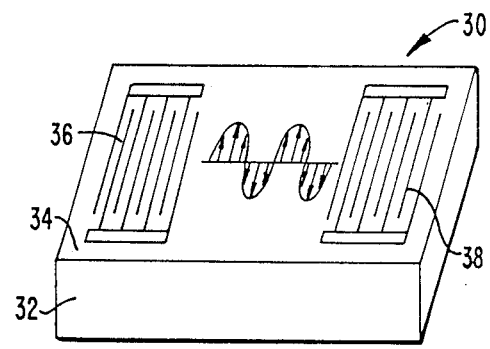
FIG._2A.
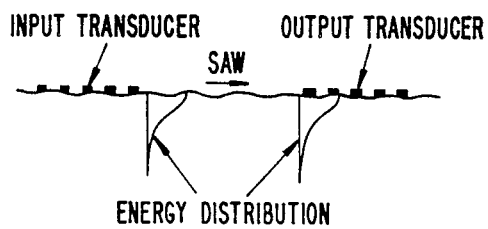
FIG._1B.
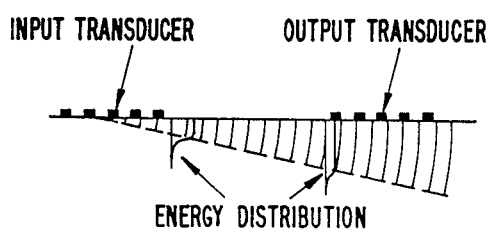
FIG._2B.
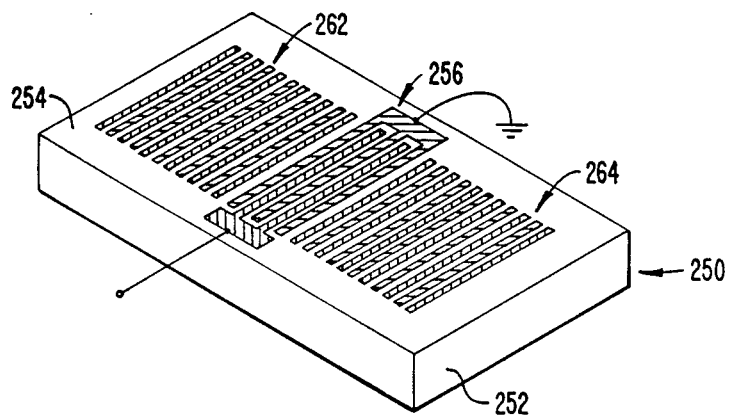
FIG._7.

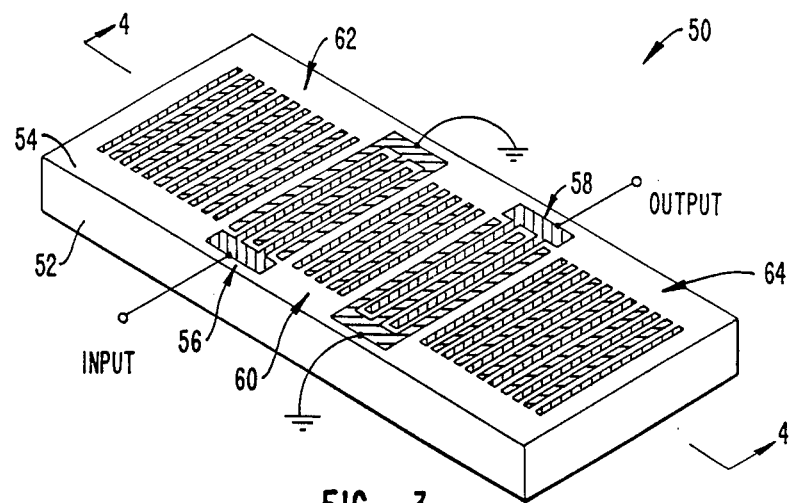
FIG._3.
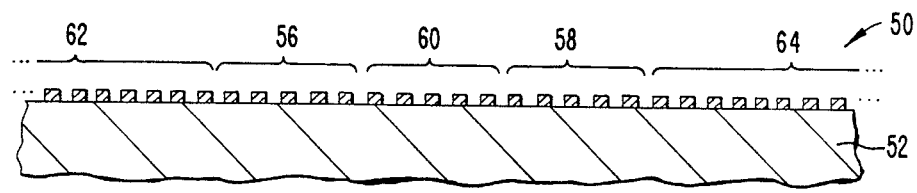
FIG._4.
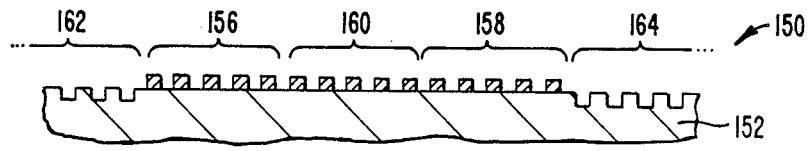
FIG._6.
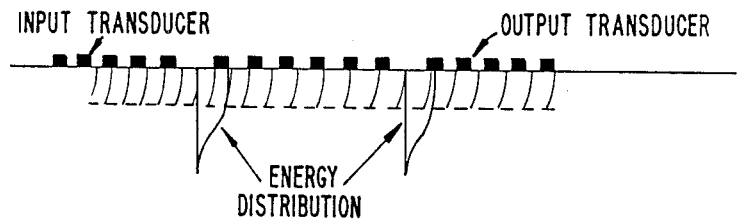
FIG._5.

SURFACE TRANSVERSE WAVE RESONATOR

CROSS REFERENCE TO RELATED APPLICATION

TECHNICAL FIELD

This application is a continuation of application Ser. No. 001,948, filed Jan. 12, 1987, now abandoned.

This application is a continuation of application Ser. No. 262,207, filed Oct. 19, 1988, now abandoned.

This application is a continuation of application Ser. No. 387,431, filed July 27, 1989, now abandoned.

This invention relates to surface elastic wave and, more particularly, to a surface transverse wave resonator.

BACKGROUND ART

There are generally two types of surface elastic wave devices. The first type is referred to as surface acoustic wave (SAW) devices. SAW devices may function as filters, oscillators or resonators. The second type is referred to as surface skimming bulk wave (SSBW) or shallow bulk acoustic wave (SBAW) devices.

In general, elastic waves are categorized into three modes of vibration—longitudinal (compressional), vertical (shear), and horizontal or transverse (shear). In surface acoustic waves, which are also referred to as Rayleigh waves, the longitudinal and vertical (shear) modes are present. In surface skimming bulk waves, only the horizontal (shear) mode is present. Examples of devices utilizing SAW or SSBW include those disclosed and illustrated in P. Cross and S. Elliott, "Surface-Acoustic-Wave Resonators," 32 *Hewlett-Packard J.* 9 (Dec., 1981); and T. Lukaszek and A. Ballato, "Microwave Frequency Sources Employing Shallow Bulk Acoustic Wave Devices," *Microwave J.* 77, (Mar., 1985).

As best shown in FIG. 1A, a conventional surface acoustic wave device such as a delay line, designated 12, would include a piezoelectric substrate 14 such as quartz having at least one surface 16 on which an input transducer 18 and an output transducer 20 are positioned. Substrate 14 is generally a single crystal quartz, or any other low-loss piezoelectric material, that has a diameter of approximately 5 centimeters and a thickness of approximately 0.5 millimeters. A commonly used piezoelectric material is lithium niobate. Surface 16 of substrate 14 is highly polished. Each of transducers 18 and 20 includes a plurality of parallel metallic bars or fingers, generally referred to as interdigital transducers (IDT's). The IDT's, generally manufactured from aluminum, are deposited onto surface 16 of substrate 14 by conventional semiconductor fabrication techniques. Each of the bars or fingers is spaced from an adjacent finger by half a wavelength, $\lambda/2$, where $\lambda = v/f$. In particular, "f" is the excitation frequency, "v" is the surface wave velocity and "$\lambda$" is the wavelength. Each of the fingers has a thickness of approximately 500 to 5,000 Angstroms(Å).

An alternating voltage of frequency "f" is then applied to the input or transmitting IDT's, creating an electric field between adjacent fingers. A stress field is then generated by the electromechanical interaction in the piezoelectric substrate immediately adjacent to the input IDT's. The vibrational waves produced by this stress field then propagate away from the IDT's as surface waves. The surface waves can be detected by a second set of remote, receiving IDT's. The detection of the surface waves is carried out by an inverse process in which the received surface waves create an electric field between the fingers of the receiving IDT's, generating a voltage that could be sensed.

If the SAW device is a resonator, it would, in addition to the IDT's, include reflectors. Each of such reflectors includes a plurality of metallic fingers which are similar to those of the transducers. The reflectors could also be manufactured as shallow grooves etched by conventional semiconductor fabrication techniques. Other periodic perturbations may also be used. In SAW resonators manufactured for use in the UHF range (30–3,000 MHz), the width of each groove, when grooves are used, varies from 0.2 to 20 microns and adjacent grooves are separated by a width of the same dimension.

The operational range of the reflector IDT's, i.e., the band of frequencies, is determined by both the periodicity and depth of the grooves when grooves are employed as reflectors. Since a surface acoustic wave generally decomposes into reflected longitudinal and vertical (shear) waves when it encounters an abrupt surface discontinuity such as the edge of the substrate, the design of the metallic bars or grooves is of paramount importance. The metallic bars or grooves must be "small" enough, i.e., either low heights for the bars or shallow depths for the grooves, such that the SAW would encounter a sufficient number of such reflectors (typically 1000) whereby a coherent reflection of the SAW would be generated at a particular frequency. Concomitantly, the reflectors cannot be so "large", i.e., great heights for the bars or great depths for the grooves, such that the SAW cannot propagate completely through the array of reflectors at that particular frequency.

SAW devices include advantages and disadvantages. Its foremost advantage is its inherent characteristic of maintaining or trapping its energy to surface 16 of substrate 14. As best shown in FIG. 1B, most of the Rayleigh wave energy is present within the topmost one wavelength, as measured from surface 16. This phenomenon is due to the fact that the two modes of Rayleigh waves, i.e., longitudinal and vertical (shear), cancel each other such that they do not diffract into the body of substrate 14, i.e., spreading away from surface 16. Thus, a SAW would propagate in the horizontal direction, maintaining its energy close to surface 16.

Its foremost disadvantage is that when high-Q (quality factor) characteristics are desired in a device such as a resonator, manufacturing difficulties are encountered. The Q factor is a comparison of the energy stored in a device in relation to the average power loss of that device at a particular frequency. This value is without a unit of measurement. If the resonator is to be used at frequencies greater than one gigahertz, the required metallization for the fingers becomes so small that semiconductor fabrication techniques have not yet been perfected to perform such a delicate deposition. In addition, the device losses due to such thin metallization, as well as the viscosity losses of the SAW in a substrate manufactured from known materials, become prohibitively large.

As best shown in FIG. 2A, a surface skimming bulk wave device, designated 30, also comprises a piezoelectric substrate 32 having at least one surface 34. An input IDT transducer 36 and an output IDT transducer 38 are provided on surface 34. SSBW device 30 illustrated in FIG. 2A is a delay line. Instead propagating Rayleigh waves, transmitting transducer 36 would launch a transverse (shear) wave that is not only parallel to surface 34 of substrate 32 but also orthogonal to the direction of propagation, as best shown in FIG. 2A.

The foremost disadvantage of SSBW devices is the inherent characteristic of the transverse (shear) waves of not propagating along surface 34 of substrate 32. Instead, the transverse (shear) waves travel at a grazing angle with respect to surface 34. If such propagation is unimpeded, the waves will eventually diffract entirely into the body of substrate 32. Having such a characteristic of propagation, the energy of the waves is not maintained within the topmost one wavelength, as best shown in FIG. 2B. As a result, the amount of energy detected by output transducer 38 is substantially smaller than that transmitted by input transducer 36. Such diffraction or scattering is especially troublesome at the discontinuities such as the interface between a free substrate surface and an IDT. Thus, the distance between transducers is a limitation in many of the applications utilizing SSBW devices.

The foremost advantage of an SSBW device is its inherent characteristic of permitting the propagating surface skimming bulk waves to travel at a higher velocity. This higher velocity characteristic, which can be as much as 60% higher than surface acoustic waves, enhances its use as filters and delay lines. Another equally important advantage is its inherent characteristic of less material attenuation, which is generally referred to as a "less lossy" condition. Material attentuation is generally defined as that portion of the energy which has been lost due to heating of the atoms and molecules of the substrate. In addition, the material attentuation of the substrate relates to the crystalline structure of the substrate. Whether or not a particular substrate is suited for either SAW or SSBW application is within the knowledge of one skilled in the art. Thus, it is well known that substrates having optimal SSBW properties, e.g., the ST-cut quartz, also minimize material attenuation. Thus, the less lossy property of SSBW devices permits the presence of more power in SSBW devices. More power may be used in SSBW devices since the depth of travel of surface skimming bulk waves is deeper than that of surface acoustic waves which travel very close to the surface of the substrate. Power is related to the fact that particle motion in the body of the substrate is greater than the particle motion at the surface of the substrate.

Other forms of losses in both SAW and SSBW devices include transduction and diffraction losses. Transduction losses, which are generally negligible, relate to the loss in energy during the conversion of electrical energy to vibrational energy, or vice versa, by the IDT transducers. Diffraction losses, which are of paramount importance in SSBW devices, relate to the diffraction of propagating waves into the body of the substrate.

DISCLOSURE OF THE INVENTION

An ideal surface elastic wave device should be capable of performing at frequencies greater than one gigahertz. In addition, the ideal surface elastic wave device should also have high-Q characteristics. Such an ideal surface elastic wave device, therfore, must have the attributes of both a surface acoustic wave device and a surface skimming bulk wave device. The ideal surface elastic wave device must not have the drawbacks of such SAW and SSBW devices.

In particular, the ideal surface elastic wave device is a resonator having the high-Q characteristics which are present in SAW devices. For example, the energy of the propagating waves of the ideal surface elastic wave device is maintained adjacent to the surface of the substrate. To compensate for the difficulties in manufacturing SAW resonators which are capable of operating at frequencies which ar greater than one gigahertz, the less lossy and higher velocity properties of SSBW devices are embodied in the ideal surface elastic wave device. For example, the velocity of the transverse (shear) waves of a quartz SSBW device is approximately 60% faster than that of the surface acoustic waves when the waves are travelling along corresponding cuts of the quartz. Thus, for the same processing geometries, 60% higher frequencies are obtained when transverse (shear) waves are used. Since the velocity of surface acoustic waves is typically five orders of magnitude slower than electromagnetic waves, e.g., 3,000 meters per second, it is therefore desirable to maximize the velocity that could propagate in a surface elastic wave device. At the same frequency, the material losses of a substrate utilizing transverse (shear) waves are also lower than the material losses for a device utilizing surface acoustic waves. Thus, the nomenclature of the present invention, viz., surface transverse wave, is descriptive of its properties in that transverse waves are altered such that they are trapped near the surface of the substrate.

Accordingly, the present invention provides a surface transverse wave resonator that comprises a piezoelectric substrate having at least one surface, wherein said substrate includes a crystalline structure that permits the propagation of transverse waves. The resonator also comprises a transducing set of periodic perturbations which are positioned atop the substrate surface, wherein the transducing set converts electromagnetic energy from an external source into the transverse waves. The resonator further comprises a receiving set of periodic perturbations which are positioned atop the substrate surface remote of the transducing set of periodic perturbations, wherein the receiving set converts the transverse waves into resultant electromagnetic energy. Moreover, the resonator includes a central set of surface-trapping periodic perturbations for maintaining the transverse waves adjacent to the substrate surface, wherein the central set is positioned intermediate the transducing set and the receiving set. Further, the resonator includes at least two sets of reflecting periodic perturbations for reflecting the transverse waves, wherein each of the sets of reflecting periodic perturbations is positioned adjacent to a respective one of the transducing set and the receiving set remote of the central set.

In the preferred embodiment, the central set of surface-trapping periodic perturbations is used to maintain the transverse waves to within one to three wavelengths of the transverse waves immediately adjacent to the substrate surface. In addition, the periodic perturbations are elongated bar members which are deposited atop the substrate surface by conventional semiconductor fabrication techniques. In particular, adjacent ones of the periodic perturbations have a center-to-center distance, and further the center-to-center distance is in the range of approximately one to 20 microns. Moreover, each of the elongated bar members has a certain height, and further the certain height is in the range of approximately 300 to 3000 Angstroms. In an alternative embodiment, the periodic perturbations of the reflecting sets are elongated grooves.

Other objects, features and advantages of the present invention will appear from the following detailed description of the best mode of a preferred embodiment, taken together with the accompanying drawings.

BRIEF DESCRIPTION OF THE DRAWINGS

FIG. 1A is a simplified, perspective view of a prior art surface acoustic wave device;

FIG. 1B is a simplified waveform for the prior art surface acoustic wave device of FIG. 1A, illustrating the energy distributions at the input and output transducers;

FIG. 2A is a simplified, perspective view of a prior art surface skimming bulk wave device;

FIG. 2B is a simplified waveform for the prior art surface skimming bulk wave device of FIG. 2A, illustrating the energy distributions at the input and output transducers;

FIG. 3 is a simplified, perspective view of a surface transverse wave resonator of the present invention;

FIG. 4 is a simplified, cross-section view of the surface transverse wave resonator of FIG. 3;

FIG. 5 is a simplified waveform for the surface transverse wave resonator of FIGS. 3 and 4, illustrating the energy distributions at the input and output transducers;

FIG. 6 is a simplified, cross-section view of an alternative embodiment of the surface transverse wave resonator of FIG. 3; and FIG. 7 is a simplified, perspective view of a further embodiment of the surface transverse wave resonator of FIG. 3.

BEST MODE FOR CARRYING OUT THE INVENTION

Referring to FIGS. 3 and 4, there is shown a surface transverse wave resonator of the present invention, designated 50. Resonator 50 comprises a piezoelectric substrate 52 that has a surface 54. Positioned atop surface 54 are a transmitting transducer (IDT's), designated 56; and a receiving transducer, designated 58. Resonator 50 also comprises a central grating region 60, which is positioned between transducers 56 and 58. Resonator 50 further comprises a pair of grating regions 62 and 64 which are positioned adjacent to transducers 56 and 58, respectively.

In particular, substrate 52 in the preferred embodiment is a rotated Y-cut quartz, for example, a 38.4 degree rotated Y-cut. In addition, substrate 52 has a thickness of approximately 20 mils. Moreover, surface 54 of substrate 52 has been polished. Each of transducers 56 and 58 and grating regions 60, 62 and 64 comprises a plurality of parallel metallic bars or fingers. These fingers, generally manufactured from aluminum, are deposited onto surface 54 in a single semiconductor fabrication step. Further, these fingers are aligned in a parallel relationship to the crystalline X-axis of substrate 52. The center-to-center distance between two adjacent fingers is approximately 0.4 to 40 microns. In the preferred embodiment, the center-to-center distance of two adjacent fingers in central grating region 60 is approximately 3.86 microns and the center-to-center distance of two adjacent fingers in each of transducers 56 and 58 and outer grating regions 62 and 64 is approximately 4.0 microns. In addition, the height of each of these fingers is approximately 300 to 3,000 Å. The individual width of the fingers may be scaled for the appropriate frequency of interest, ranging from 100 MHz to 5 GHz. The width of the fingers and the frequency of interest have an inverse proportional relationship. This relationship is well understood by one skilled in the art. For example, for the above-mentioned frequencies, the width of the fingers for transducers 56 and 58, as well as the width for the fingers of grating regions 60, 62 and 64, may vary from 0.2 micron to 20 microns. In the preferred embodiment, there are approximately 32 fingers in central region 60 and approximately 700-800 fingers in each of outer regions 62 and 64.

In operation, an alternating voltage is supplied to transmitting transducer 56 such that an electric field is created between the fingers of transducer 56. A stress field is then generated by the electromechanical action in the piezoelectric substrate 52 immediately underneath transducer 56. Due to the particular crystalline structure of the quartz substrate, this stress field includes transverse vibrational waves. The transverse vibrational waves are also referred to as transverse or horizontal (shear) waves, surface skimming bulk waves, or shallow bulk acoustic waves. The transverse waves then propagate toward receiving transducer 58. These vibrational waves then create an electric field between the fingers of transducer 58, generating a voltage that could be measured.

Transverse waves have an inherent characteristic of diffracting into the body of substrate 52 as they propagate from transmitting transducer 56 to receiving transducer 58, as best illustrated in FIG. 2B. To maximize, or to "trap", the propagating transverse waves, central grating region 60 is provided. The fingers of central region 60 are used to maintain the transverse waves to the topmost one to three wavelengths immediately underneath surface 54 of substrate 52. With the propagating transverse waves trapped within the uppermost one to three wavelengths, as best shown in FIG. 5, the energy of the propagating waves is not diffracted, such that the amount of energy detected by receiving transducer 58 is maximized.

In particular, the trapping of transverse (shear) waves to a surface of a first substrate is accomplished by the presence of a guiding layer, the shear velocity of which is less than that of the first substrate. This guiding layer is positioned immediately atop the surface of the first substrate. Such trapped shear waves are generally referred to as Love modes. See Matthews, *Surface Wave Filters*, pages 33-38 (1977). In the present invention, the aluminum fingers of transducers 56 and 58 and regions 60, 62 and 64 generate such Love modes by slowing down the transverse waves which are propagating in substrate 52, thereby trapping the transverse waves to the area immediately adjacent to surface 54 of substrate 52. The depth of penetration of such Love modes is a function of the heights of the aluminum fingers. In addition, the heights of the aluminum fingers also affect the strength of the piezoelectric coupling to the transverse waves. Thus, for each type of device, there is a specific metallic finger thickness which maximizes the device Q-factor and minimizes device insertion or transduction losses.

As for the metallic fingers of outer regions 62 and 64, they are primarily used to coherently reflect the transverse waves back to the center of substrate 52 at the resonant frequency. The use of fingers or other perturbations to reflect propagating waves is well known in the art, e.g. "Surface-Acoustic-Wave Resonators," supra. The metallic fingers of outer regions 62 and 64 also contribute to the surface trapping effect. In addition, the metallic fingers of central region 60 also have some negligible reflection capabilities. Similarly, the fingers of transducers 56 and 58 are also used for both trapping and reflection in addition to their primary function of transduction.

Embodying the attributes of both a surface acoustic wave device and a surface skimming bulk wave device, the resonant frequency of device 50 is higher than that of prior art SAW devices having similar metal geometries. Next, device 50 is capable of having a higher Q as compared to prior art SAW devices. Moreover, device 50 can be operated with increased power which is due to the increased depth of travel of the transverse waves, resulting in lower power density for a given level of circulating power. The increased power phenomenon may also be the result of particle motion in the metallic bars in that such particle motion is also in the transverse (shear) direction. With both the metallic bars and the substrate vibrating in the same direction, the metallic bars may be less prone to stress-induced damage. Further, device 50 has less metallic disturbances, i.e., less atomic movement at the surface which should result in retarding device aging. Furthermore, device 50 is more stable at the gigahertz frequencies than prior art SAW devices.

As best shown in FIG. 6, there is illustrated a cross-section view of an alternative embodiment of resonator 50. Since the alternative transverse wave resonator is similar to resonator 50 of the preferred embodiment, corresponding elements of the alternative resonator are designated by adding a numeral "1", e.g., the substrate is designated 152. In resonator 150, transducers 156 and 158, as well as central grating region 160, are comprised of metallic fingers which are deposited by conventional semiconductor fabrication techniques. Grating regions 162 and 164, however, comprise grooves instead of metallic fingers. The grooves of regions 162 and 164 are etched by conventional semiconductor fabrication techniques. Having the grooved configuration, resonator 150 would have an even higher Q than resonator 50, since grooves reflect nearly 100% of the incident wave.

It will be apparent to those skilled in the art that various modifications may be made within the spirit of the invention and the scope of the appended claims. For example, both resonators 50 and 150 illustrate 2-port devices, i.e., two transducers. A single-port or multiple port devices may be manufactured by having a single transducer for a single-port device, or "n" transducers for an "n-port" device. A single-port device is illustrated in FIG. 7. Elements which correspond to their counterparts in resonator 50 are designated by adding a numeral "2".

We claim:

1. A method for operating a surface elastic wave device to provide a surface skimming bulk wave device in the form of a surface transverse wave resonator, comprising;
    providing a piezoelectric substrate having at least one surface, wherein said substrate includes a crystalline structure that permits the propagation of transverse waves;
    providing at least one set of transducing periodic perturbations which are in contact with said substrate surface, said at least one set of transducing periodic perturbations having first and second edges substantially perpendicular to the direction of propagation of said transverse waves, wherein said one set of transducing perturbations transduces electromagnetic energy from an external source into acoustic waves including said transverse waves; and
    confining said transverse waves adjacent to said substrate surface and reflecting said transverse waves by providing at least two sets of surface-trapping and reflecting periodic perturbations substantially perpendicular to the direction of propagation of said transverse waves, at least one of said sets of reflecting periodic perturbations being disposed opposite each of said respective edges of said at least one set of transducing periodic perturbations.

2. The method of operating the surface transverse wave resonator as claimed in claim 1, wherein said surface-trapping and reflecting periodic perturbations confine said transverse waves to within one to three wavelengths of said transverse waves immediately adjacent to said substrate surface.

3. The surface transverse wave resonator as claimed in claim 2, wherein adjacent ones of said periodic perturbations have a center-to-center distance, and further wherein said center-to-center distance is in the range of approximately one to 20 microns.

4. The surface transverse wave resonator as claimed in claim 3, wherein each of said perturbations is an elongated bar member in contact with said substrate surface.

5. The surface transverse wave resonator as claimed in claim 4, wherein each of said elongated bar members has a certain height, and further wherein said certain height is in the range of approximately 300 to 3000 Angstroms.

6. The method of operating the surface transverse wave resonator as claimed in claim 3, wherein each of said surface-trapping and reflecting periodic perturbations is an elongated groove.

7. A method for operating a surface elastic wave device to provide a surface skimming bulk wave (SSBW) device in the form of a surface transverse wave resonator, comprising:
    providing a piezoelectric substrate having at least one surface, wherein said substrate includes a crystalline structure that permits the propagation of transverse waves;
    providing a transducing set of periodic perturbations which are in contact with said substrate surface, said transducing set of periodic perturbations having first and second edges substantially perpendicular to the direction of propagation of said transverse waves, wherein said transducing set converts electromagnetic energy from an external source into acoustic waves including said transverse waves;
    providing a receiving set of periodic perturbations which are in contact with said substrate surface remote of said transducing set of periodic perturbations, said receiving set of periodic perturbations having first and second edges substantially perpendicular to the direction of propagation of said transverse waves, wherein said receiving set converts said transverse waves into resultant electromagnetic energy;
    providing a central set of surface-trapping periodic perturbations for confining said transverse waves adjacent to said substrate surface, wherein said central set is positioned intermediate said transducing set and said receiving set; and providing at least two sets of reflecting periodic perturbations substantially perpendicular to the direction of propagation of said transverse waves for reflecting said transverse waves, wherein each of said sets of reflecting periodic perturbations is positioned adjacent to a respective one of said transducing set and said receiving set remote of said central set.

8. The method of operating the surface transverse wave resonator as claimed in claim 7, wherein said central set of surface-trapping periodic perturbations confines said transverse waves to within one to three wavelengths of said transverse waves immediately adjacent to said substrate surface.

9. The surface transverse wave resonator as claimed in claim 8, wherein adjacent ones of said periodic perturbations have a center-to-center distance, and further wherein said center-to-center distance is in the range of approximately one to 20 microns.

10. The surface transverse wave resonator as claimed in claim 9, wherein said center-to-center distance of said periodic perturbations of said transducing set, said receiving set and said reflecting sets is approximately 4.0 microns, and said center-to-center distance of said periodic perturbations of said central set is approximately 3.86 microns.

11. The surface transverse wave resonator as claimed in claim 10, wherein each of said periodic perturbations is an elongated bar member in contact with said substrate surface.

12. The surface transverse wave resonator as claimed in claim 11, wherein each of said elongated bar members has a certain height and further wherein said certain height is in the range of approximately 300 to 3000 Angstroms.

13. The surface transverse wave resonator as claimed in claim 12, wherein said substrate is a 38.4 degree rotated Y-cut quartz.

14. The surface transverse wave resonator as claimed in claim 13, wherein said transducing set, said receiving set and said reflecting sets perform the surface trapping of said transverse waves.

15. The surface transverse wave resonator as claimed in claim 14, wherein said resonator operates in the frequency range of approximately 100 MHz to 5 GHz.

16. The surface transverse wave resonator as claimed in claim 15, wherein said elongated bar members are deposited onto said substrate surface by semiconductor fabrication techniques.

17. The surface transverse wave resonator as claimed in claim 10, wherein each of said periodic perturbations of said reflecting sets is an elongated groove.

18. The surface transverse wave resonator as claimed in claim 17, wherein said substrate is 38.4 degree Y-cut quartz.

19. The surface transverse wave resonator as claimed in claim 18, wherein said transducing set, said receiving set and said reflecting sets perform the surface trapping of said transverse waves.

20. The surface transverse wave resonator as claimed in claim 19, wherein said resonator operates in the frequency range of approximately 100 MHz to 5 GHz.

21. The method of operating the surface transverse wave resonator as claimed in claim 20, wherein said elongated grooves are fabricated by semiconductor fabrication techniques.

* * * * *

UNITED STATES PATENT AND TRADEMARK OFFICE
CERTIFICATE OF CORRECTION

PATENT NO. : 4,965,479  
DATED : Oct. 23, 1990  
INVENTOR(S) : Scott S. Elliott, Robert C. Bray, Timothy L. Bagwell and Peter S. Cross Page 1 of 3

It is certified that error appears in the above-indentified patent and that said Letters Patent is hereby corrected as shown below:

Col. 4, Line 8, "which ar greater" should read -- which are greater --

Claim 1, Line 3, of Amend. 03/02/89, ";" should read -- : --

Claims 2 through 8 insert after
"The" -- method of operating the --

Col. 8, Line 20, "3. The surface transverse" should read -- 3. The method of operating the surface transverse --

Col. 8, Line 25, "4. The surface transverse" should read -- 4. The method of operating the surface transverse --

Col. 8, Line 31, "5. The surface transverse" should read -- 5. The method of operating the surface transverse --

Claim 8 through 21, Line 1, after "The"
insert -- method of operating the --

Col. 9, Line 15, "9. The surface transverse" should read -- 9. The method of operating the surface transverse --

Col. 9, Line 20, "10. The surface transverse" should read -- 10. The method of operating the surface transverse --

Col. 9, Line 28, "11. The surface transverse" should read -- 11. The method of operating the surface transverse --

UNITED STATES PATENT AND TRADEMARK OFFICE
CERTIFICATE OF CORRECTION

PATENT NO. : 4,965,479  
DATED : Oct. 23, 1990  
INVENTOR(S) : Scott S. Elliott, Robert C. Bray, Timothy L. Bagwell and Peter S. Cross Page 2 of 3

It is certified that error appears in the above-indentified patent and that said Letters Patent is hereby corrected as shown below:

Col. 9, Line 31, "12. The surface transverse" should read -- 12. The method of operating the surface transverse --

Col. 10, Line 3, "13. The surface transverse" should read -- 13. The method of operating the surface transverse --

Col. 10, Line 6, "14. The surface transverse" should read -- 14. The method of operating the surface transverse --

Col. 10, Line 10, "15. The surface transverse" should read -- 15. The method of operating the surface transverse --

Col. 10, Line 13, "16. The surface transverse" should read -- 16. The method of operating the surface transverse --

Col. 10, Line 17, "17. The surface transverse" should read -- 17. The method of operating the surface transverse --

Col. 10, Line 20, "18. The surface transverse" should read -- 18. The method of operating the surface transverse --

Col. 10, Line 23, "19. The surface transverse" should read -- 19. The method of operating the surface transverse --

UNITED STATES PATENT AND TRADEMARK OFFICE
CERTIFICATE OF CORRECTION

PATENT NO. : 4,965,479          Page 2 of 3
DATED      : Oct. 23, 1990
INVENTOR(S) : Scott S. Elliott, Robert C. Bray, Timothy L. Bagwell and Peter S. Cross It is certified that error appears in the above-indentified patent and that said Letters Patent is hereby corrected as shown below:

Col. 10, Line 27, "20. The surface transverse" should read --20. The method of operating the surface transverse--.

Signed and Sealed this

Twenty-fifth Day of January, 1994

Attest:

BRUCE LEHMAN

Attesting Officer         Commissioner of Patents and Trademarks